US009757919B2

(12) United States Patent
Vest et al.

(10) Patent No.: US 9,757,919 B2
(45) Date of Patent: Sep. 12, 2017

(54) CARRIER SHEET AND METHOD OF USING THE SAME

(71) Applicant: MacDermid Printing Solutions, LLC, Waterbury, CT (US)

(72) Inventors: Ryan W. Vest, Cumming, GA (US); Harold Blair, Dallas, GA (US)

( * ) Notice: Subject to any disclaimer, the term of this patent is extended or adjusted under 35 U.S.C. 154(b) by 54 days.

(21) Appl. No.: 14/830,833

(22) Filed: Aug. 20, 2015

(65) Prior Publication Data

US 2017/0050421 A1    Feb. 23, 2017

(51) Int. Cl.
| | |
|---|---|
| *B32B 37/00* | (2006.01) |
| *B32B 5/00* | (2006.01) |
| *G03F 7/00* | (2006.01) |
| *B32B 5/18* | (2006.01) |
| *B32B 33/00* | (2006.01) |
| *B32B 38/00* | (2006.01) |

(52) U.S. Cl.
CPC ............... *B32B 5/18* (2013.01); *B32B 33/00* (2013.01); *B32B 38/145* (2013.01); *B32B 2266/0278* (2013.01); *B32B 2307/7244* (2013.01); *B32B 2309/02* (2013.01); *B32B 2309/105* (2013.01)

(58) Field of Classification Search
CPC ..... B32B 7/00; B32B 37/005; B32B 37/0053; B32B 5/00; B32B 5/10; G03F 7/00; G03F 7/20; G03F 7/26
See application file for complete search history.

(56) References Cited

U.S. PATENT DOCUMENTS

| | | | |
|---|---|---|---|
| 3,265,765 A | 8/1966 | Holden et al. | |
| 3,867,153 A | 2/1975 | MacLachlan | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A * | 11/1986 | Min ......................... | G03F 7/16 156/244.11 |
| 5,135,827 A | 8/1992 | Bohm et al. | |
| 5,223,375 A | 6/1993 | Berrier et al. | |
| 5,262,275 A | 11/1993 | Fan | |
| 5,925,500 A | 7/1999 | Yang | |
| 6,238,837 B1 | 5/2001 | Fan | |
| 8,492,073 B2 * | 7/2013 | Armstrong ................ | G03F 7/34 430/306 |
| 2007/0190452 A1 * | 8/2007 | Kimelblat ................ | B41N 1/12 430/270.1 |
| 2014/0004466 A1 * | 1/2014 | Vest ........................ | G03F 7/092 430/306 |

FOREIGN PATENT DOCUMENTS

| | | |
|---|---|---|
| EP | 0 456 336 | 11/1991 |
| EP | 0 640 878 | 3/1995 |
| GB | 1 366 769 | 9/1974 |

* cited by examiner

*Primary Examiner* — Jacob T Minskey
*Assistant Examiner* — Matthew Hoover
(74) *Attorney, Agent, or Firm* — Carmody Torrance Sandak & Hennessey LLP

(57) ABSTRACT

A carrier sheet for providing support to a photocurable printing blank as the photocurable printing blank is conveyed through a plurality of laminating rollers that laminate an oxygen barrier layer to a top surface of the photocurable printing blank. The carrier sheet includes a heat resistant dimensionally-stable backing layer; and a resilient layer mounted on the heat resistant dimensionally-stable backing layer.

14 Claims, No Drawings

CARRIER SHEET AND METHOD OF USING THE SAME

FIELD OF THE INVENTION

The present invention relates generally to a carrier sheet for use in a lamination stage of a flexographic printing plate making process.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally, the most widely used support layer is a flexible film of polyethylene terephthalate. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

One process that has been developed involves the use of a laminated oxygen barrier layer, as described, for example, in U.S. Pat. Pub. No. 2014/0004466 to Vest et al., the subject matter of which is herein incorporated by reference in its entirety. The barrier membrane is laminated on top of the flexo plate to cover the in situ mask and any uncovered portions of photocurable layer. The membrane can be applied after the laser ablation used to create the in situ mask, but before exposure to actinic radiation. By using this oxygen barrier membrane, the shape of printing dots formed on a printing element can be beneficially changed by removing or limiting diffusion of air into the photocurable layer during exposure to actinic radiation.

SUMMARY OF THE INVENTION

A wide range of materials can serve as the barrier membrane layer. Effective barrier layers generally exhibit optical transparency, low thickness and oxygen transport inhibition. The barrier membrane needs to be sufficiently impermeable to oxygen diffusion so that it can effectively limit diffusion of oxygen into the photocurable layer during exposure to actinic radiation. Oxygen transport inhibition is measure in terms of a low oxygen diffusion coefficient and the barrier membrane may preferably have a coefficient of oxygen diffusion of less than $6.9 \times 10^{-9}$ m$^2$/sec, preferably less than $6.9 \times 10^{-10}$ m$^2$/sec and most preferably less than $6.9 \times 10^{-11}$ m$^2$/sec. The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%. The barrier membrane should also be as thin as possible, consistent with the structural needs for handling of the film and the film/photopolymer plate combination. Barrier membrane thicknesses between about 1 and 100 microns are preferred, with thickness of between about 1 and about 5 microns being most preferred.

Examples of materials which are suitable for use as the barrier membrane layer of the present invention include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films.

As described above, the oxygen barrier membrane is laminated to the relief image printing element in a lamination stage prior to the exposure of the printing element to actinic radiation to crosslink and cure the at least one photocurable layer and create the relief image in the at least one photocurable layer.

During the lamination stage, a carrier sheet (or lamination sled), is used to provide support to the relief image printing element while it passes through the lamination station to laminate the oxygen barrier membrane thereon. This carrier sheet is typically a hard board or other rigid material that provides a stiff backing for the printing element being laminated.

However, the inventors of the present invention have found that when processing soft or thick flexographic printing elements, the lamination window can be relatively small. In addition, the carrier sheet materials are relatively bulky and hard to maneuver within the platemaking processing environment. Thus, it would also be desirable to develop an improved carrier sheet that has greater maneuverability and that overcomes the deficiencies of the prior art.

It is an object of the present invention to increase the lamination window during lamination of oxygen barrier membranes to soft and/or thick flexographic plates.

It is another object of the present invention to decrease the weight and thickness of carrier sheets used for transporting flexographic plates through a lamination stage.

It is still another object of the present invention to use a flexible carrier sheet that can be easily transported and maneuvered in the plate making process.

It is still another object of the present invention to reduce the cost of the carrier sheet material and increase its handleability.

To that end, in one embodiment, the present invention relates generally to a carrier sheet for providing support to a photocurable printing blank as the photocurable printing blank is conveyed through at least one laminating roller, wherein the at least one of laminating roller laminates an oxygen barrier layer to a top surface of the photocurable printing blank, wherein the carrier sheet comprises:
 a) a heat resistant dimensionally-stable backing layer; and
 b) a resilient layer mounted on, or adhered to, the heat resistant dimensionally-stable backing layer. The resilient layer is also preferably resistant to the temperatures involved in the resilient layer should not permanently be deformed by the temperatures and pressures used in the process.

In another embodiment, the present invention relates generally to a method of laminating an oxygen barrier layer to a surface of a flexographic printing blank prior to exposure of the printing blank to actinic radiation to selectively crosslink and cure the flexographic printing blank and create a relief image therein, wherein the flexographic printing blank comprising one or more photocurable layers disposed on a backing layer, the method comprising the steps of:
 a) positioning the flexographic printing blank on a carrier sheet, wherein the carrier sheet comprises:
  i) a heat resistant dimensionally-stable backing layer; and
  ii) a resilient layer mounted on, or adhered to, the heat resistant dimensionally-stable backing layer; and
 b) passing the flexographic printing blank and the carrier sheet through at least one laminating roller to laminate an oxygen barrier membrane to a surface of the flexographic printing blank,
wherein the presence of the carrier layer improves the processing window of lamination.

DETAILED DESCRIPTION OF THE PREFERRED EMBODIMENTS

As described herein, the inventors of the present invention have found that the processing window during lamination stage can be increased by the use of an improved carrier sheet described herein.

By processing window, what is meant is that the lamination parameters, including, for example, the application of a compressive lamination force, the duration of the application of compressive lamination force, and/or the temperature of the sheet and/or film contact surface at the location at which the compressive lamination force is applied (i.e., the lamination location), that may be adjusted to produce a laminated barrier layer on the relief image printing element that has good adhesion over the entire surface of the relief image printing element without any wrinkling or bubbling of the barrier layer. Thus, the inventors of the present invention have found that by the use of the carrier sheets described herein, these lamination parameters may be more widely adjusted to produce the desired result of a uniformly adherent oxygen barrier layer that does not exhibit any wrinkling, bubbling or other defects that would adversely affect the development of the relief image therein.

The hardness (or softness) of flexographic printing plates may be measured according to its Shore A value which is a measure of the durometer of a material. A harder, less resilient, printing plate has a high Shore A value, while a softer printing plate has a much lower Shore A value. As defined herein, soft plates, are those flexo plates that exhibit a Shore A value of less than about 60, more preferably a Shore A value of less than about 50.

In addition, flexographic relief image printing elements generally have a thickness of between about 0.1 mm to about 8 mm (about 4 mils to about 315 mils) or more, depending on a number of factors, including the substrate being printed, the composition of the photocurable layers, among others. As defined herein a thick printing plate is one that has a thickness of greater than about 2.75 mm, more preferably greater than about 5 mm.

Based thereon, in one embodiment, the present invention relates generally to a carrier sheet for providing support to a photocurable printing blank as the photocurable printing blank is conveyed through at least one laminating roller, wherein the at least one laminating roller laminates an oxygen barrier layer to a top surface of the photocurable printing blank, wherein the carrier sheet comprises:

a) a heat resistant dimensionally-stable backing layer; and
b) a resilient layer mounted on, or adhered to, the heat resistant dimensionally-stable backing layer.

The backing sheet preferably comprises a thermoplastic polymer, and more preferably comprises a polycarbonate. What is important is that the backing sheet remains dimensionally stable at the laminating temperature.

Polycarbonates are amorphous thermoplastic polymers that contain carbonate groups in their chemical structures. Polycarbonates exhibit high impact strength, high modulus of elasticity and good dimensionally stability. In addition, polycarbonates are also heat stable. Other similar polymers or materials that exhibit similar properties would also be usable in the practice of the invention.

The polycarbonate layer is rigid but at the same time has flexibility that allows it to be rolled so that it may be easily transported. The polycarbonate layer typically has a thickness of between about 0.75 mm and about 2 mm. The inventors have found that thicknesses within this range provide good dimensional stability while also providing sufficient rigidity for use as the backing sheet and are also extremely lightweight.

The resilient layer offers compressibility. Thus, when pressure is applied to the surface of the resilient layer, it is absorbed by the cell structure, causing little or no distortion of the printing plate blank mounted thereon. Thus, even during lamination of a barrier layer to the surface of a soft or thick printing plate blank, the barrier layer is uniformly laminated, without any distortion or wrinkling that will adversely affect the structure of the relief image being created in subsequent process steps.

In a preferred embodiment, the resilient layer is a compressible layer that comprises an open cell structure. Thus, the resilient layer compresses to absorb applied pressure and returns to its original state when pressure is released. The resilient layer lasts over repeated usage and can be reused many times without breaking down. In a particularly preferred embodiment, the resilient layer comprises an open cell microcellular urethane foam layer. One suitable material for this layer is available from Rogers Corporation under the Tradename R/bak®.

The resilient layer is bonded to the backing layer to create a composite material that can be used as a carrier sheet to support the printing plate during the lamination step and can also be used to support the printing plate during other steps in the platemaking process.

The resilient layer has a thickness of between about 0.020 and 0.20 inches, more preferably, between about 0.035 and about 0.10 inches. Thus, the carrier sheet composite material has a thickness of between about 0.050 inches and about 0.225 inches.

The heated laminating roller is typically maintained at a temperature of at least about 150° F., more preferably at a temperature of at least about 200° F. However, one skilled in the art would recognize that the temperature of the laminating roller would depend at least in part on the melting point of the particular laminating film selected and would choose a suitable temperature of the laminating film accordingly. Thus, the carrier sheet described herein must provide good dimensional stability at the laminating temperature. More than one laminating roller may be used.

A drive mechanism rotates the heated laminating roller and the second roller. The drive mechanism typically comprises a driver which drives a motor to rotate the heated laminating roller in a first direction and the second roller in a second direction as the carrier sheet with the photocurable printing blank mounted thereon passes through the nip between the heated lamination roller and the second roller.

The heated laminating roller typically comprises a heated core that can be controlled to maintain an outer surface of the heated laminating roller at a desired temperature with an elastic roller disposed around the heated core that may be formed of silicone rubber or another similar elastic material. Suitable control means can be used to maintain the heated laminating roller at the desired temperature for the particular laminating film being used.

In addition to increasing the processing window of lamination, the composite material described herein is also very lightweight in comparison with the carrier sheet materials of the prior art and thus has much greater maneuverability. Furthermore, the composite carrier sheet material described herein can also be rolled up for shipment, thus drastically reducing shipping costs as the improved composite material can be quickly and efficiently shipped globally.

In another embodiment the present invention relates generally to a method of laminating an oxygen barrier layer to a surface of a flexographic printing blank prior to exposure of the printing blank to actinic radiation to selectively crosslink and cure the flexographic printing blank and create a relief image therein, wherein the flexographic printing blank comprising one or more photocurable layers disposed on a backing layer, the method comprising the steps of:

a) positioning the flexographic printing blank on a carrier sheet, wherein the carrier sheet comprises:
   i) a heat resistant dimensionally-stable backing layer; and
   ii) a resilient layer mounted on the heat resistant dimensionally-stable backing layer; and
b) passing the flexographic printing blank and the carrier sheet through at least one laminating roller to laminate an oxygen barrier membrane to a surface of the flexographic printing blank, wherein the presence of the carrier layer improves the processing window of lamination.

After the oxygen barrier membrane has been laminated to a surface of the printing blank, the printing blank is exposed to actinic radiation to selectively crosslink and cure the at least one photocurable layer and create a desired relief image therein. Thereafter, the imaged and exposed printing blank is developed to reveal the relief image therein. Development may be accomplished by various methods, including water development, solvent development and thermal development, by way of example and not limitation.

In one embodiment, the one or more photocurable layers are selectively exposed to actinic radiation by disposing a laser ablatable mask layer on the at least one photocurable layer, which is then selectively ablate to create an in situ negative of the desired image in the laser ablatable mask layer. In another embodiment, a conventional negative may also be used. Thereafter, the one or more photocurable layers are imaged through the in situ negative or conventional negative to selectively crosslink and cure portions of the one or more photocurable layers. In still another embodiment, a direct write laser may be used to create the desired relief image in the one or more photocurable layers without the need for a mask.

As described above, the use of the carrier sheet increases the processing window of lamination, especially when laminating oxygen barrier membranes to soft printing elements of thick printing elements to produce the desired result.

Finally, the relief image printing element may be mounted on a printing cylinder of a printing press and printing is commenced.

What is claimed is:

1. A method of laminating an oxygen barrier layer to a surface of a flexographic printing blank prior to exposure of the printing blank to actinic radiation to selectively crosslink and cure the flexographic printing blank and create a relief image therein, wherein the flexographic printing blank comprises an in situ mask, and a photocurable layer disposed on a support sheet, the method comprising the steps of:
   a) positioning the flexographic printing blank on a carrier sheet such that the carrier sheet supports the flexographic printing blank, wherein the carrier sheet comprises:
      i) a heat resistant dimensionally-stable backing layer; and
      ii) a resilient layer mounted on, or adhered to, the heat resistant dimensionally-stable backing layer; and
   b) passing the flexographic printing blank and the carrier sheet through at least one laminating roller to laminate an oxygen barrier membrane to a surface of the flexographic printing blank, wherein the oxygen barrier membrane covers the in situ mask and any uncovered portions of the photocurable layer.

2. The method according to claim 1, wherein the flexographic printing blank has a thickness of greater than about 4 mm.

3. The method according to claim 1, wherein the flexographic printing blank has a Shore A value of less than about 60.

4. The method according to claim 3, wherein the flexographic printing blank has a Shore A hardness of less than about 50.

5. The method according to claim 1, wherein at least one of the laminating rollers is maintained at a temperature of at least about 150° F.

6. The method according to claim 1, wherein the heat resistant dimensionally-stable backing layer comprises a thermoplastic polymer.

7. The method according to claim 6, wherein the thermoplastic polymer is a polycarbonate.

8. The method according to claim 1, wherein the heat resistant dimensionally-stable backing layer has a thickness of between about 0.050 and about 0.225 inches.

9. The method according to claim 1, wherein the resilient layer comprises a compressible layer.

10. The method according to claim 9, wherein the compressible layer comprises an open cell structure.

11. The method according to claim 10, wherein the compressible layer comprises an open cell microcellular urethane foam layer.

12. The method according to claim 1, wherein the resilient layer has a thickness of between about 0.020 and about 0.20 inches.

13. The method according to claim 12, wherein the resilient layer has a thickness of between about 0.035 and about 0.10 inches.

14. The method according to claim 1, wherein the resilient layer is bonded to the heat resistant dimensionally-stable backing layer.

* * * * *